US009853057B2

(12) United States Patent
Shih et al.

(10) Patent No.: US 9,853,057 B2
(45) Date of Patent: Dec. 26, 2017

(54) DISPLAY ARRAY SUBSTRATE AND MANUFACTURING METHOD THEREOF

(71) Applicant: HON HAI PRECISION INDUSTRY CO., LTD., New Taipei (TW)

(72) Inventors: Po-Li Shih, Hsinchu (TW); Yi-Chun Kao, Hsinchu (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/213,586

(22) Filed: Jul. 19, 2016

(65) Prior Publication Data
US 2016/0329351 A1 Nov. 10, 2016

Related U.S. Application Data

(62) Division of application No. 14/556,731, filed on Dec. 1, 2014, now Pat. No. 9,425,294.

(30) Foreign Application Priority Data

Apr. 1, 2014 (TW) .............................. 103112204 A

(51) Int. Cl.
H01L 29/66 (2006.01)
H01L 29/78 (2006.01)
H01L 27/12 (2006.01)
H01L 29/786 (2006.01)
H01L 29/49 (2006.01)

(52) U.S. Cl.
CPC ........ H01L 27/1214 (2013.01); H01L 27/124 (2013.01); H01L 29/4908 (2013.01); H01L 29/66969 (2013.01); H01L 29/7869 (2013.01)

(58) Field of Classification Search
CPC ... H01L 29/66; H01L 29/786; H01L 29/7869; H01L 29/66969; H01L 29/78; H01L 29/49; H01L 29/4908; H01L 27/12; H01L 27/124; H01L 27/1214
USPC ..................................................... 257/43, 252
See application file for complete search history.

(56) References Cited

U.S. PATENT DOCUMENTS

| 5,541,748 | A | * | 7/1996 | Ono | H01L 27/1214 349/138 |
| 6,329,226 | B1 | | 12/2001 | Jones et al. | |
| 2003/0036222 | A1 | * | 2/2003 | Takemura | H01L 21/2022 438/149 |
| 2006/0243979 | A1 | | 11/2006 | Park et al. | |
| 2015/0115275 | A1 | * | 4/2015 | Park | G02F 1/13452 257/72 |
| 2016/0210894 | A1 | * | 7/2016 | Lee | H05K 1/028 |

FOREIGN PATENT DOCUMENTS

CN    1858911 A    11/2006

* cited by examiner

Primary Examiner — Chuong A Luu
(74) Attorney, Agent, or Firm — ScienBiziP, P.C.

(57) ABSTRACT

A display array substrate includes a substrate, a plurality of gate lines and a plurality of data lines disposed on the substrate, and a plurality of gate connecting pads. Each gate connecting pad is disposed at an end of one of the gate lines. The end of each gate line is partly covered by a first insulation layer. The first insulation layer is an anodic oxide layer.

9 Claims, 10 Drawing Sheets

DISPLAY ARRAY SUBSTRATE AND MANUFACTURING METHOD THEREOF

CROSS-REFERENCE TO RELATED APPLICATIONS

This application is a divisional application of U.S. Ser. No. 14/556,731, filed Dec. 1, 2014 now U.S. Pat. No. 9,425,294 the contents of which are hereby incorporated by reference. The patent application Ser. No. 14/556,731 in turn claims the benefit of priority under 35 USC 119 from Taiwan Patent Application No. 103112204, filed on Apr. 1, 2014.

FIELD

The subject matter herein generally relates to a display array substrate, and more particularly, to a display array substrate having an anodized layer as a gate insulator and a manufacturing method thereof.

BACKGROUND

In the display industry, TFT (Thin Film Transistor) has been broadly applied as a switch element. For the category of metal oxide semiconductor, aluminum oxide ($Al_2O_3$) is usually utilized as one kind of material to form a gate insulator through anodization of aluminum on a display array substrate and further, in the peripheral area of the display array substrate, a thorough hole must be formed by etching the corresponding part of aluminum oxide ($Al_2O_3$) in order to expose an end of gate lines for electrically connecting to an outside of the display array substrate. However, it is difficult to increase the etching rate in order to improve the efficiency of manufacturing the display array substrate.

BRIEF DESCRIPTION OF THE DRAWINGS

Implementations of the present technology will now be described, by way of example only, with reference to the attached figures.

DETAILED DESCRIPTION

Figure 1:
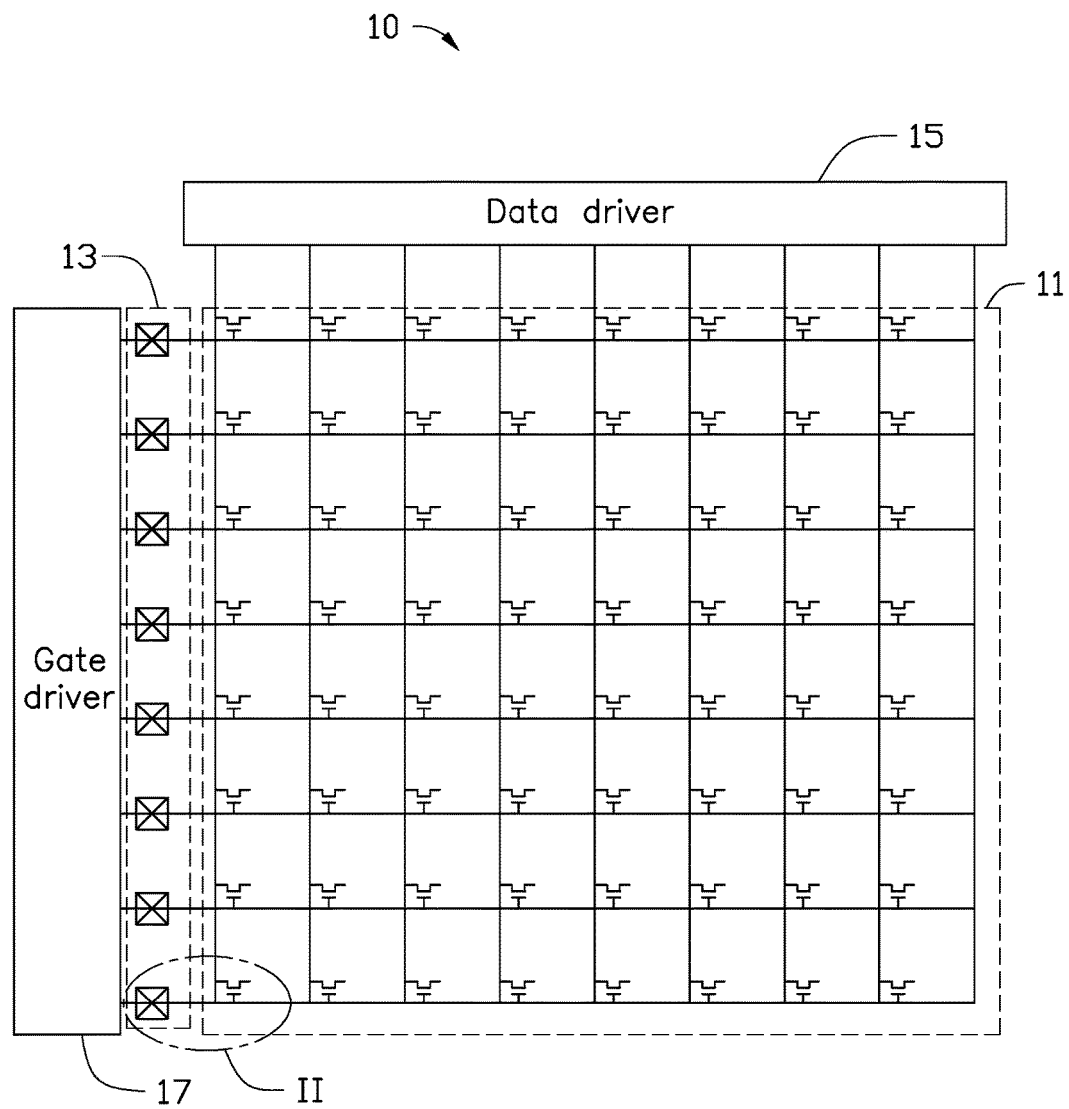
FIG. 1 is a diagrammatic view of a display array substrate of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Figure 2:
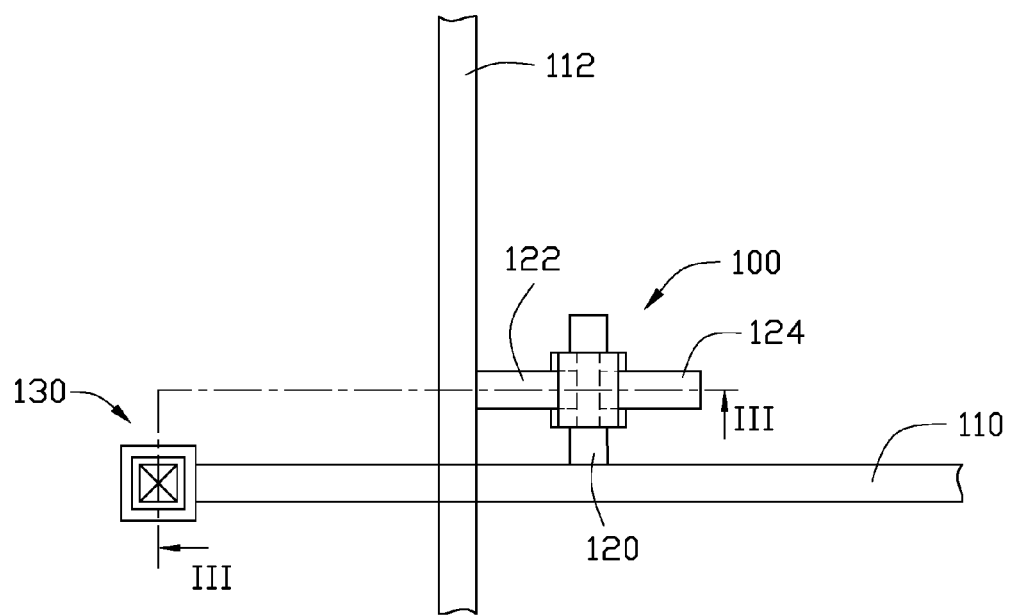
FIG. 2 is a diagrammatic view of the zone II of FIG. 1.
Figure 3:
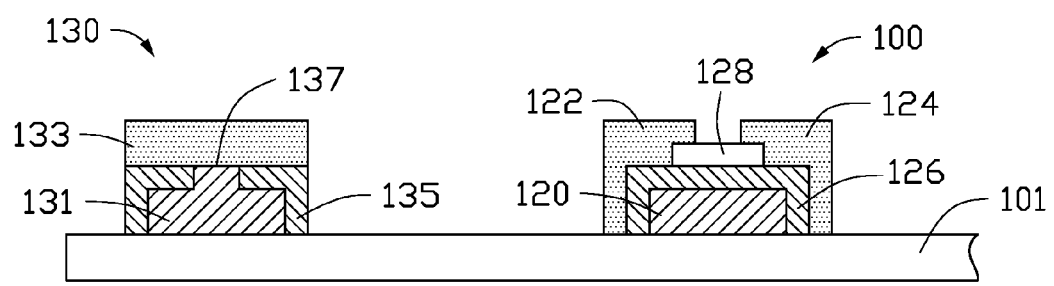
FIG. 3 is a cross-sectional view taken along line III-III of the display array substrate of FIG. 2.

Referring to FIG. 1 though FIG. 3, FIG. 1 is a diagrammatic view of a display array substrate of the present disclosure. FIG. 2 is a diagrammatic view of the zone II of FIG. 1. FIG. 3 is a cross-sectional view taken along line III-III of the display array substrate of FIG. 2. In detail, the display array substrate 10 includes a display area 11 and a peripheral area 13. In the display area 11, a plurality of gate lines 110 are disposed on the display array substrate 10 in a first direction and a plurality of data lines 112 are disposed on the display array substrate 10 in a second direction so as to intersect the gate lines 110 in the display area 11. A plurality of TFTs (thin film transistors) 100 are disposed at an intersection area defined by the gate lines 110 and the data lines 112. Moreover, a plurality of gate connecting pads 130 is disposed in an end 131 of the gate lines 110 in the peripheral area 13.

A TFT (thin film transistor) 100 further includes a gate electrode 120 connected to the gate line 110 for receiving a plurality of gate signals from a gate driver 17 through the gate connecting pads 130 and a source electrode 122 connected to the data line 112 for receiving a plurality of data signals from a data driver 15. A drain electrode 124 is spaced apart from the source electrode 122.

The TFT (thin film transistor) 100 also includes a gate insulator 126 and a channel layer 128. The gate connecting pad 130 includes the end 131 of the gate line 110 and a pad electrode 133. The end 131 of the gate line 110 is partly covered by a first insulation layer 135 and a thorough hole 137 is formed on the first insulation layer 135 so as to electrically connect the end 131 of the gate line 110 to the pad electrode 133. Furthermore, the first insulation layer 135 is formed by directly anodizing the end 131 of gate line 110 except for a region where the thorough hole 137 is formed.

The gate electrode 120 and the end 131 of gate line 110 are disposed on a substrate 101 and the source electrode 122 is disposed on the same level as the drain electrode 124. Moreover, the source electrode 122 and the drain electrode 124 are connected through the channel layer 128 positioned opposite to the gate electrode 120. The gate insulator 126 is positioned between the gate electrode 120 and the channel layer 128. When a voltage generated based on the gate signal is higher than the threshold voltage of the TFT (thin film transistor) 100, the electronic characteristic of the channel layer 128 of the TFT (thin film transistor) 100 is changed so the data signal is transmitted from the source electrode 122 to the drain electrode 124 through the channel layer 128.

Figure 10:
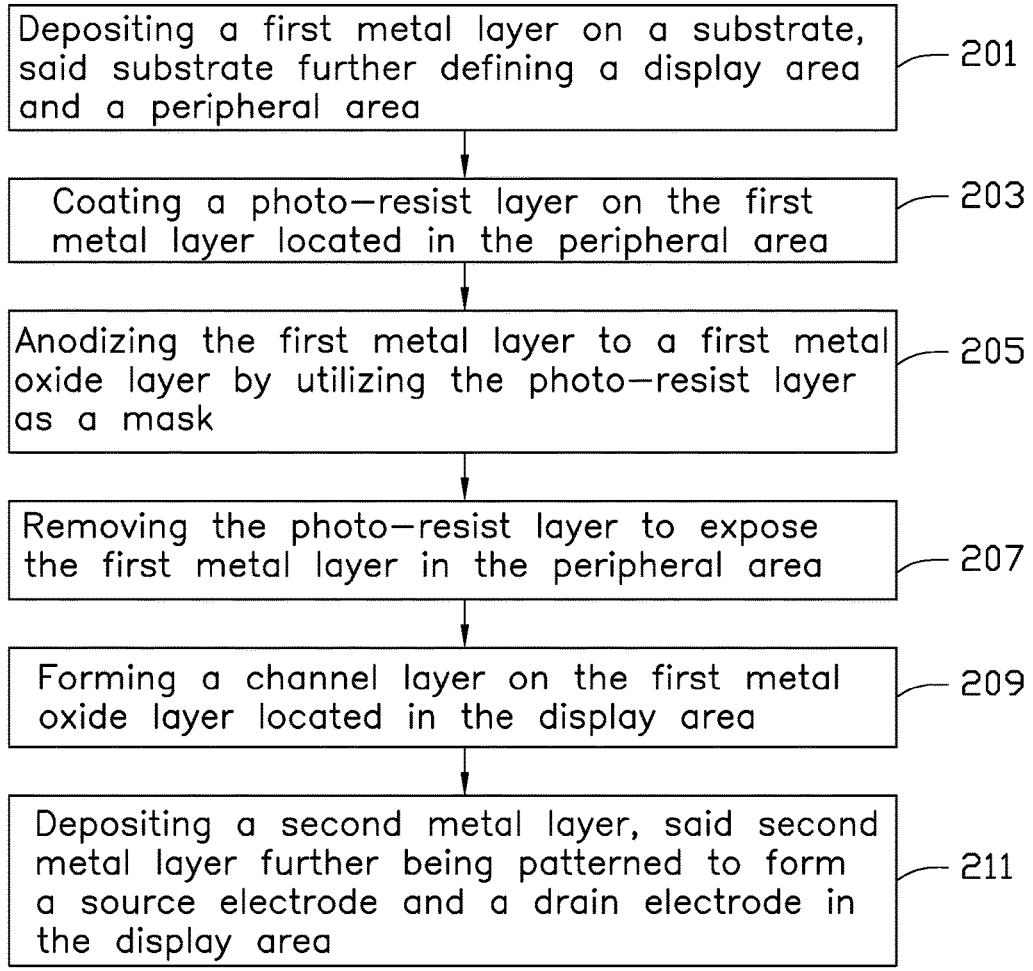
FIG. 10 is a flow chart illustrating the process of manufacturing TFT (Thin Film Transistor) of FIG. 1.

Referring to FIG. 10, a flowchart is presented in accordance with an example embodiment which is being thus illustrated. The example method is provided by way of example, as there are a variety of ways to carry out the method. The method described below can be carried out using the configurations illustrated in FIGS. 4 and 5, for example, and various elements of these figures are referenced in explaining example method. Each block shown in FIG. 10 represents one or more processes, methods or subroutines, carried out in the example method. Additionally, the illustrated order of blocks is by example only and the order of the blocks can change according to the present disclosure. The example method can begin at block 201.

Figure 4:
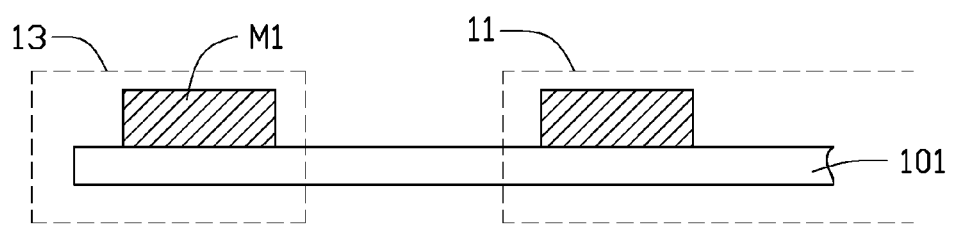
FIG. 4 is a diagrammatic view illustrating a first step of a process of manufacturing TFT (Thin Film Transistor) of FIG. 1.

At block 201, referring to FIG. 4, FIG. 4 is a diagrammatic view illustrating a first step of a process of manufacturing TFT (Thin Film Transistor) of FIG. 1, a first metal layer M1 is deposited and patterned to form at least two portions on the substrate 101 where the peripheral area 13 and the display area 11 are further defined. In the present invention, the substrate 101 is a transparent substrate like a glass substrate or a quartz substrate. The first metal layer M1 may be formed of aluminum but not limited to.

Figure 5:
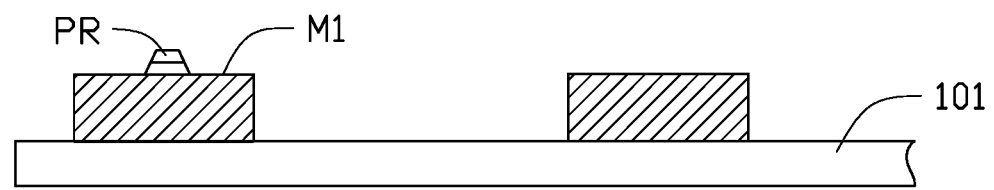
FIG. 5 is a diagrammatic view illustrating a second step of a process of manufacturing TFT (Thin Film Transistor) of FIG. 1.

At block 203, referring to FIG. 5, FIG. 5 is a diagrammatic view illustrating a second step of a process of manufacturing TFT (Thin Film Transistor) of FIG. 1, a photo-resist layer PR is coated on the first metal layer M1 located in the peripheral area 13.

Figure 6:
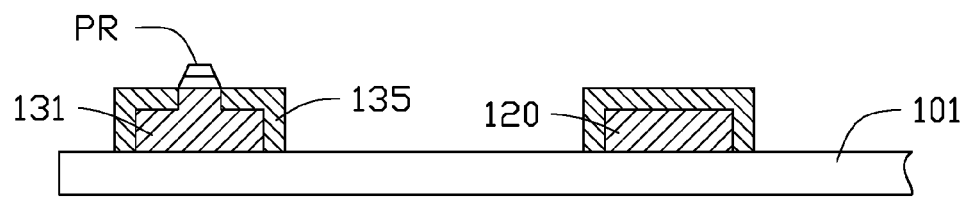
FIG. 6 is a diagrammatic view illustrating a third step of a process of manufacturing TFT (Thin Film Transistor) of FIG. 1.

At block 205, referring to FIG. 6, FIG. 6 is a diagrammatic view illustrating a third step of a process of manufacturing TFT (Thin Film Transistor) of FIG. 1, by utilizing the photo-resist layer PR, the first metal layer M1 is anodized to the first metal oxide layer 135. An un-anodized part of the first metal layer M1 in the display area 11 is defined as the gate electrode 120 and an un-anodized part of the first metal layer M1 in the peripheral area 13 is also defined as the end 131 of the gate line 110. It can be understood that the gate line 110 and the gate electrode 120 are formed in the same step. In an embodiment of the present invention, the first metal oxide layer 135 is formed of aluminum oxide.

Figure 7:
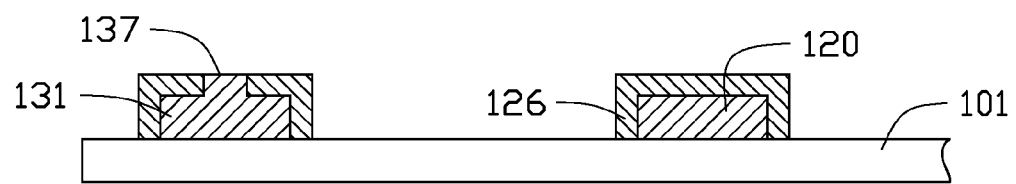
FIG. 7 is a diagrammatic view illustrating a fourth step of a process of manufacturing TFT (Thin Film Transistor) of FIG. 1.

At block 207, referring to FIG. 7, FIG. 7 is a diagrammatic view illustrating a fourth step of a process of manufacturing TFT (Thin Film Transistor) of FIG. 1, the first metal oxide layer 135 is patterned to form the gate insulator 126 in the display area 11 and by removing the photo-resist layer PR, the though hole 137 is formed so as to expose the end 131 of the gate line 110.

Figure 8:
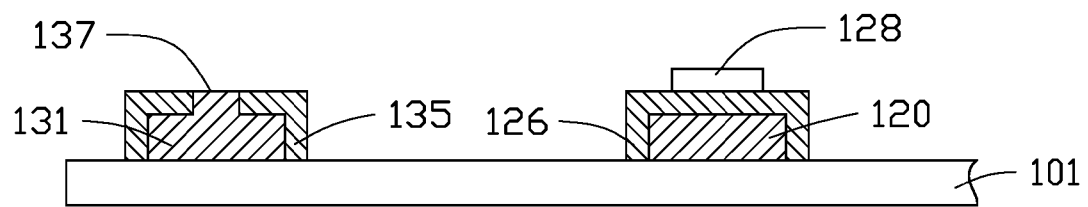
FIG. 8 is a diagrammatic view illustrating a fifth step of a process of manufacturing TFT (Thin Film Transistor) of FIG. 1.

At block 209, referring to FIG. 8, FIG. 8 is a diagrammatic view illustrating a fifth step of a process of manufacturing TFT (Thin Film Transistor) of FIG. 1, the channel layer 128 is formed on the gate insulator 126 and is made of one kind of metal oxide semiconductor like indium gallium zinc oxide (IGZO), zinc oxide (ZnO), indium oxide (InO), gallium oxide (GaO) or its mixture. In an embodiment of the present invention, by utilizing a sputter method, a vacuum deposition, a pulsed laser deposition, an ion plating method, a metal organic chemical vapor deposition, a plasma method or the like, a metal oxide semiconductor layer is deposited on the gate insulator 126 and the metal oxide semiconductor layer is further patterned to form the channel layer 128.

Figure 9:
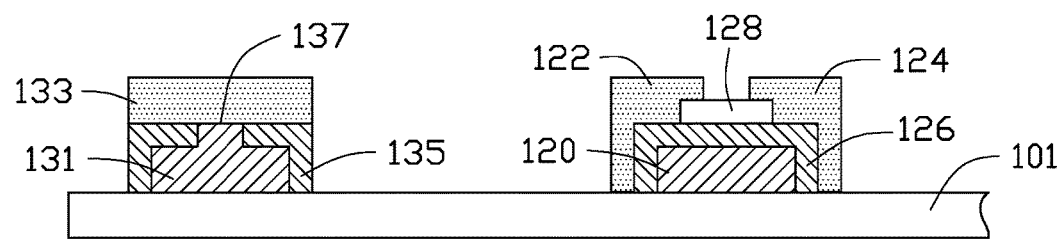
FIG. 9 is a diagrammatic view illustrating a sixth step of a process of manufacturing TFT (Thin Film Transistor) of FIG. 1.

At block 211, referring to FIG. 9, FIG. 9 is a diagrammatic view illustrating a sixth step of a process of manufacturing TFT (Tin Film Transistor) of FIG. 1, a second metal layer is deposited and further patterned to the source electrode 122 and the drain electrode 124 in the display area 11. In the peripheral area 13, the second metal layer is patterned to form the pad electrode 133. The second metal layer is made of metal or metal alloy, like molybdenum (Mo), aluminum (Al), chromium (Cr), copper (Cu), neodymium (Nd), or the mixture. By utilizing a photolithographic process, the second metal layer is patterned to form the source electrode 122 and the drain electrode 124. In an embodiment of the present invention, the photolithographic process is a wet etching process.

In the following process, a planarization layer and a pixel electrode can be formed on the TFT (thin film transistor) 100 as known in the art.

By utilizing the photo-resist layer PR as a mask, the though hole 137 is not needed to be etched on the first metal oxide layer 135 so the efficiency of manufacturing the display array substrate 10 can be improved.

The embodiments shown and described above are only examples. Many details are often found in the art such as the other features of a display. Therefore, many such details are neither shown nor described. Even though numerous characteristics and advantages of the present technology have been set forth in the foregoing description, together with details of the structure and function of the present disclosure, the disclosure is illustrative only, and changes may be made in the details, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A display array substrate, comprising:
   a substrate defining a display area and a peripheral area surrounding the display area;
   a plurality of gate lines on the substrate and extending along a first direction;
   a plurality of data lines on the substrate and extending along a second direction so as to intersect the plurality of gate lines in the display area;
   a plurality of thin film transistors on the substrate and in the display area; and
   a plurality of gate connecting pads in the peripheral area, each of the plurality of gate connecting pads being at an end of one of the plurality of gate lines;
   wherein the end of each gate line is partly covered by a first insulation layer and the first insulation layer is an anodic oxide layer; the first insulation layer defines a plurality of through holes, the end of each of the plurality of gate lines is electrically coupled to one of the plurality of gate connecting pads by one of the plurality of through holes.

2. The display array substrate of claim 1, wherein the first insulation layer and the end of each gate line are formed by anodizing a single metal layer.

3. The display array substrate of claim 1, wherein each thin film transistor comprises a gate electrode on the substrate, a gate insulator layer on the gate electrode and a channel layer on the gate insulator layer.

4. The display array substrate of claim 3, wherein the gate insulator layer is an anodic oxide layer.

5. The display array substrate of claim 4, wherein the gate insulator layer and the gate electrode are formed by anodizing a single metal layer.

6. The display array substrate of claim 3, wherein each thin film transistor further comprises a source electrode and a drain electrode on the gate insulator layer and the source electrode and the drain electrode coupled to the channel layer.

7. The display array substrate of claim 3, wherein the source electrode is spaced apart from the drain electrode.

8. The display array substrate of claim 3, wherein the gate electrode is electrically connected to one gate line for receiving a plurality of gate signals from a gate driver through the gate connecting pad.

9. The display array substrate of claim 3, wherein the source electrode is electrically connected to one data line for receiving a plurality of data signals from a data driver.

\* \* \* \* \*